United States Patent
Chang

(10) Patent No.: US 6,541,791 B2
(45) Date of Patent: Apr. 1, 2003

(54) METHOD AND SYSTEM FOR SEMICONDUCTOR DIE TESTING

(75) Inventor: Kou-Yung Chang, Changhua Hsien (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/847,024

(22) Filed: May 1, 2001

(65) Prior Publication Data
US 2002/0132379 A1 Sep. 19, 2002

(30) Foreign Application Priority Data
Mar. 14, 2001 (TW) ........................ 90105925 A

(51) Int. Cl.[7] .............................................. H01L 23/58
(52) U.S. Cl. ....................................................... 257/48
(58) Field of Search ............................................ 257/48

(56) References Cited

U.S. PATENT DOCUMENTS 4,989,209 A * 1/1991 Littlebury et al.

* cited by examiner

*Primary Examiner*—Fetsum Abraham
(74) *Attorney, Agent, or Firm*—Ladas & Parry

(57) ABSTRACT

The present invention provides a multi-channel semiconductor test system for testing a plurality of pins of at least a die, the system comprising a testing device, a handler and a multiplexer. The testing device tests the pins of the die and derives a plurality of testing results. The handler has a plurality of channels fewer than the pins and the test results are read by the handler through the channels. The multiplexer receives and sequentially outputs the test results, whereby the testing device derives all the test results simultaneously and sequentially outputs the test results to the handler through the channels.

9 Claims, 3 Drawing Sheets

METHOD AND SYSTEM FOR SEMICONDUCTOR DIE TESTING

BACKGROUND OF THE INVENTION

1. Field of the Invention

The present invention relates to a method and system for semiconductor die testing, and particularly to a method and system for multi-channel testing wherein the channels are fewer than the total pins of the dies to be tested.

2. Description of the Prior Art

FIG. 1 is a block diagram of a conventional semiconductor die test system. The system comprises a handler 1, a testing device 2 and an interface 3.

The handler 1 comprises an accepter 13 which accepts a wafer (not shown). One of the dies 11 on the wafer is tested by the system. The die 11 has 8 pins p1~p8. A display 14 in the handler 1 displays testing results of the pins p1~p8 read by the handler 1 through channels 15a~15h.

The testing device 2 comprises a tester 22 and a test module 21 corresponding to the die 11. When an embedded memory test is carried out, the tester 22 controls the test module 21 to generate a group of test signals to the pins p1~p8 of the die 11 through a bus L1. Then, the test module 21 derives a group of testing results through the bus L1 and transfers them to the tester 22. On the other hand, when logic testing is carried out, the test module 22 is bypassed and the tester 22 directly tests the die 11.

The tester 22 transfers the received testing results to the interface 3 through a bus L2 and then the testing results are input to the channels 15a~15h through a bus L3.

FIG. 2 is a flow chart of a test method for the above test system.

First, in step 21, a die on a wafer is selected. Logic testing of the selected die is carried out.

Next, in step 22, an embedded memory test is carried out.

Finally, in step 23, if there is another die on the wafer to be tested, steps 21 and 22 are repeated. Otherwise, the test is finished.

The test method for the conventional test system is sequential, i.e. the dies to be tested must be processed one by one if there are not enough channels. The duration of testing will be increased proportionally to the number of the dies to be tested. Thus makes the conventional test method time-consuming. Additionally, embedded memory testing is much more time-consuming than logic testing. 95% of the total duration of die testing is for embedded memory testing. A fast embedded memory test will effectively reduce the total testing duration.

Besides, in the conventional test system, the number of the pins of the die to be tested should match that of the channels. For example, a handler with 16 channels matches a die with 8 pins because two of the dies can be tested at one time by the handler without any channel left unused. On the other hand, the handler does not match a die with 9 pins because only one of the die can be tested at one time and 7 of the channels are left unused.

SUMMARY OF THE INVENTION

The object of the present invention is to provide a method and system for semiconductor die testing with a shorter testing duration.

To achieve the above-mentioned object, the present invention provides a multi-channel semiconductor test system for testing a plurality of pins of at least a die, the system comprising a testing device, a handler and a multiplexer. The testing device tests the pins of the die and derives a plurality of testing results. The handler has a plurality of channels fewer than the pins and the testing results are read by the handler through the channels. The multiplexer receives and sequentially outputs the testing results, whereby the testing device derives all the testing results simultaneously and sequentially outputs the testing results to the handler through the channels.

The present invention further provides a multi-channel semiconductor test system for testing a plurality of dies, the system comprising: a testing device, a handler and a multiplexer. The testing device tests the dies and derives a plurality of groups of testing results. The handler has a group of channels and the groups of testing results are read in group by the handler through the group of channels. The multiplexer receives and sequentially outputs the groups of the testing results, whereby the testing device derives all the groups of the testing results simultaneously and sequentially outputs the groups of the testing results in group to the handler through the group of the channels.

The present invention further provides a test method for a plurality of semiconductor dies, wherein a plurality of test modules in corporation with a handler having a group of channels tests the dies and derives a plurality of groups of testing results, and the handler reads the groups of the testing results in group through the group of the channel. The method comprises the steps of controlling the test modules, simultaneously generating corresponding test signals to the dies, deriving the groups of the testing results, and sequentially outputting the groups of the testing results in group to the handler through the group of channels.

In the present invention, a multiplexer is provided to sequentially output the testing results to the handler. This allows embedded memory testing to be carried out simultaneously for all the dies to be tested, even if the channels are fewer than the pins of the dies.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
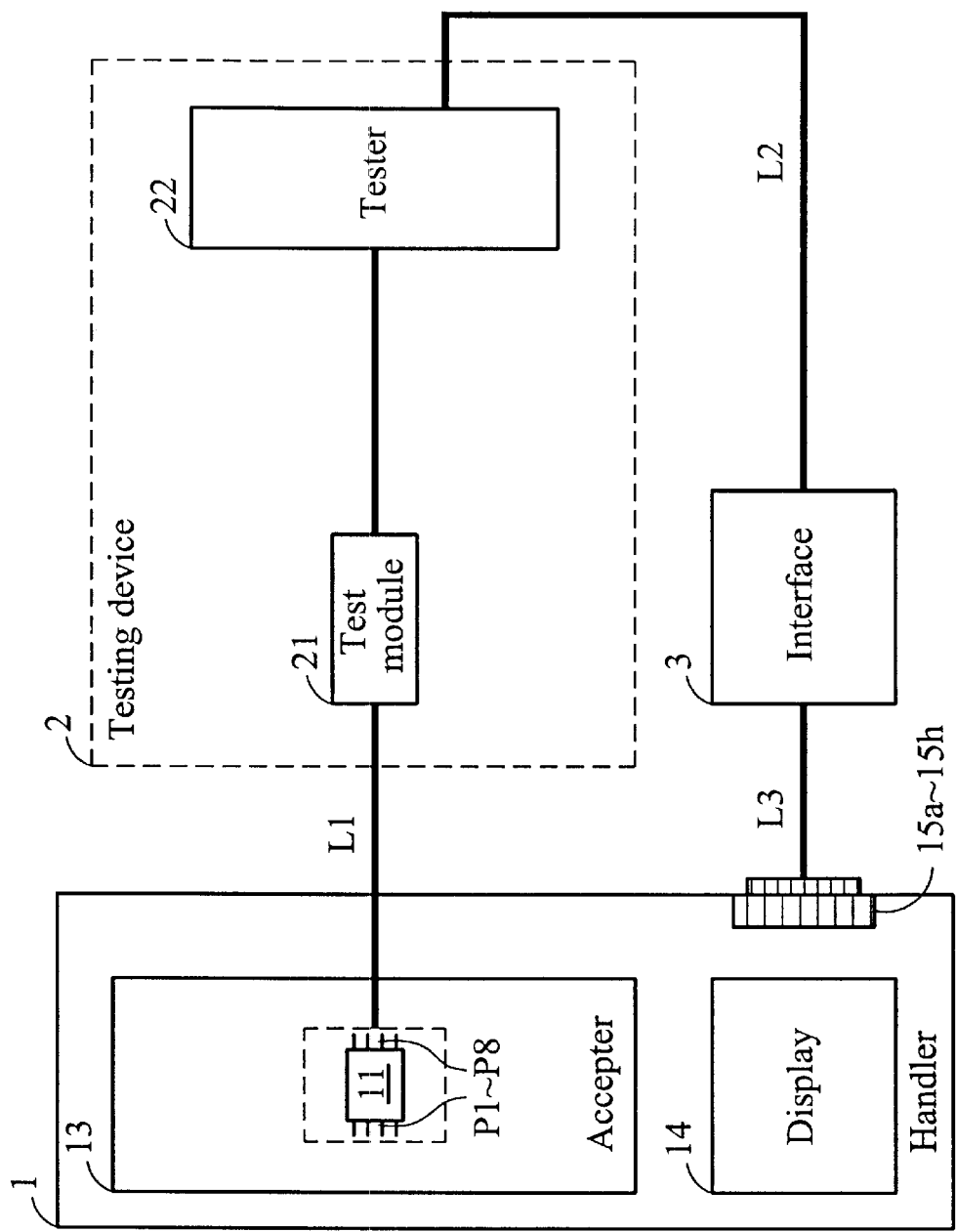
FIG. 1 is a block diagram of a conventional semiconductor die test system.
Figure 2:
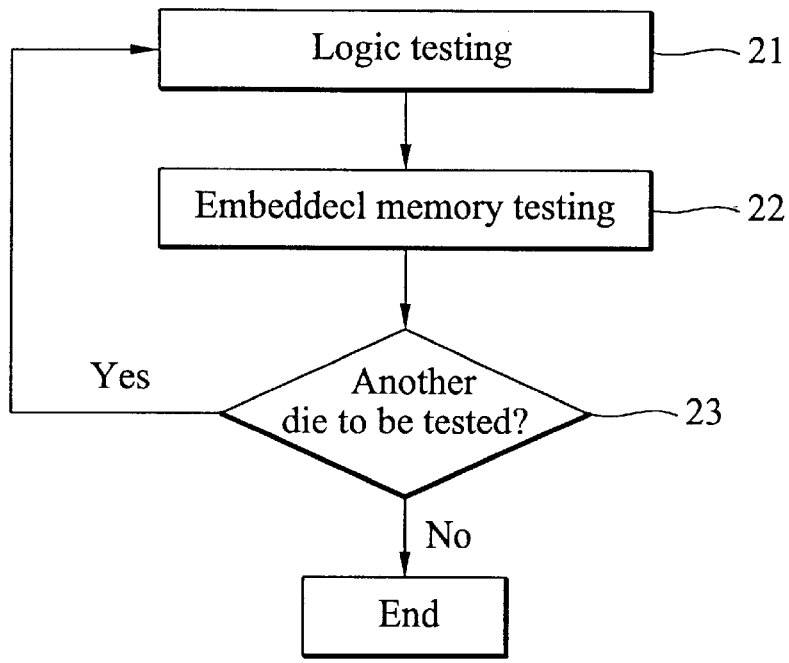
FIG. 2 is a flow chart of a test method for a conventional semiconductor die test system.
Figure 3:
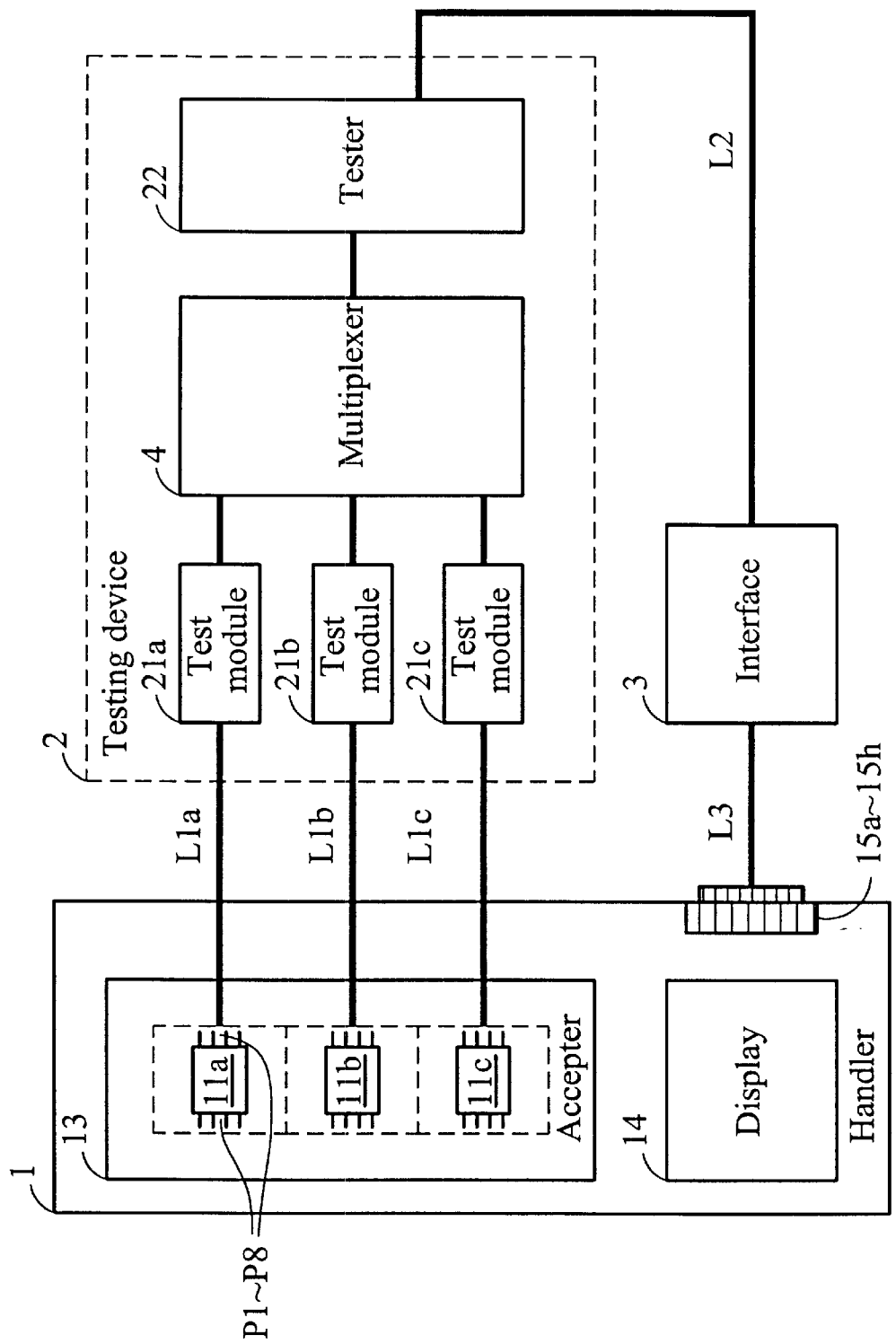
FIG. 3 is a block diagram of a semiconductor die test system according to an embodiment of the invention.

FIG. 3 is a block diagram of a semiconductor die test system according to an embodiment of the invention. Elements in FIG. 1 and FIG. 3 are referred to using the same symbols. The system comprises a handler 1, a testing device 2, an interface 3 and a multiplexer 4.

The handler 1 comprises an accepter 13 which accepts a wafer (not shown). Three dies 11a, 11b and 11c on the wafer are tested by the system. Each of the dies 11a, 11b and 11c has 8 pins p1~p8. A display 14 in the handler 1 displays testing results of the pins p1~p8 of the dies 11a, 11b and 11c read by the handler 1 through channels 15a~15h.

The testing device 2 comprises a tester 22 and three test modules 21a, 21b and 21c corresponding to the dies 11a, 11b and 11c respectively. A multiplexer 4 is connected between the tester 22 and the test modules 21a, 21b and 21c. When an embedded memory test is carried out, the tester 22 controls the test modules 21a,21b and 21c to simultaneously generate three groups of test signals to the dies 11a, 11b and 11c through buses L1,L2 and L3, respectively. Then, the test module 21a,21b and 21c derive three groups of testing results through the buses L1,L2 and L3 respectively, and simultaneously transfers them to the multiplexer 4. The multiplexer 4 further transfers the testing results in group to the tester 22 sequentially, i.e. one group by one group. On the other hand, when a logic testing is carried out, the test modules 22a, 22b and 22c are bypassed and the tester 22 directly tests the dies 11a, 11b and 11c.

The tester 22 transfers one received group of the testing results to the interface 3 through a bus L2 and then to the channels 15a~15h through a bus L3.

Figure 4:
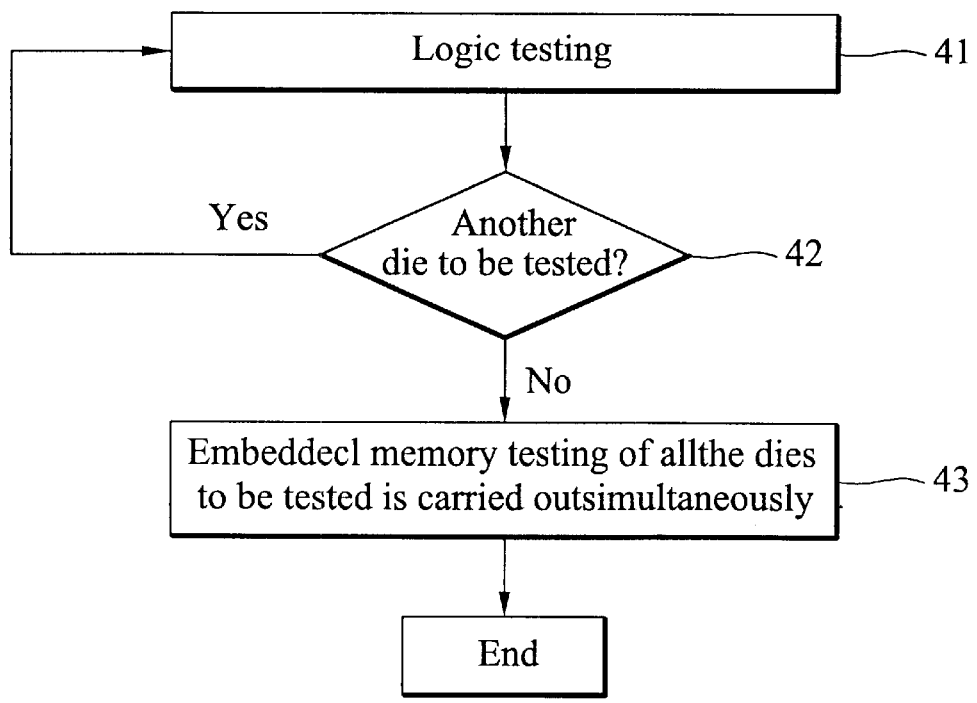
FIG. 4 is a flow chart of a test method for a semiconductor die test system according to an embodiment of the invention.

FIG. 4 is a flow chart of a test method for the above test system.

First, in step 41, a die on a wafer is selected. A logic testing of the selected die is carried out.

Next, in step 42, if there is another die on the wafer to be logic-tested, the step 41 is repeated for it until there is no die to be logic-tested.

Finally, in step 43, embedded memory testing is carried out simultaneously for all the dies to be embedded-memory-tested.

Thereby, in the test method provided by the invention, embedded memory testing is carried out for all the dies simultaneously and the testing results are sequentially read out. This shortens the duration of the embedded memory testing significantly, irrespective of the number of dies to be tested.

The present invention applies as long as the total pins of the dies to be tested are more than the channels even if the pin number of the dies do not match the number of the channels. For example, a handler with 16 channels can test two 9-pin dies at one time. The total number of the pins of the dies to be tested is 18. The multiplexer sequentially uses the 9 of the channels to transfer the testing results.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A multi-channel semiconductor test system for testing a plurality of pins of at least a die, the system comprising:
   a testing device testing the pins of the die and deriving a plurality of testing results;
   a handler having a plurality of channels fewer than the pins and the testing results being read by the handler through the channels; and
   a multiplexer receiving and sequentially outputting the testing results, whereby the testing device derives all the testing results simultaneously and sequentially outputs the testing results to the handler through the channels.

2. The system as claimed in claim 1 wherein the testing device comprises at least a test module for generating a test signal to the pins and deriving the testing results.

3. The system as claimed in claim 2 wherein the testing device further comprises a tester controlling the test module.

4. The system as claimed in claim 3 wherein the multiplexer is connected between the tester and the test module.

5. A multi-channel semiconductor test system for testing a plurality of dies, the system comprising:
   a testing device testing the dies and deriving a plurality of groups of testing results;
   a handler having a group of channels and the groups of testing results being read in group by the handler through the group of channels; and
   a multiplexer receiving and sequentially outputting the groups of the testing results, whereby the testing device derives all the groups of the testing results simultaneously and sequentially outputs the groups of the testing results in group to the handler through the group of the channels.

6. The system as claimed in claim 5 wherein the testing device comprises a plurality of test modules for generating corresponding test signals to the dies and deriving the groups of the testing results.

7. The system as claimed in claim 6 wherein the testing device further comprises a tester controlling the test modules.

8. The system as claimed in claim 7 wherein the tester controls the test modules, simultaneously generating all of the corresponding test signals to the dies and deriving the groups of the testing results.

9. The system as claimed in claim 7 wherein the multiplexer is connected between the test modules and the tester.

* * * * *